United States Patent [19]

Epstein

[11] Patent Number: 5,270,658
[45] Date of Patent: Dec. 14, 1993

[54] MEANS AND METHOD FOR TESTING AND MONITORING A CIRCUIT BREAKER PANEL ASSEMBLY

[76] Inventor: Barry M. Epstein, 7523 Cliffbrook, Dallas, Tex. 75240

[21] Appl. No.: 746,720

[22] Filed: Aug. 19, 1991

[51] Int. Cl.⁵ .............................................. G01R 31/32
[52] U.S. Cl. ................................... 324/424; 324/537; 340/638; 361/118
[58] Field of Search .................. 324/424, 537, 550; 340/638, 639; 361/117, 118

[56] References Cited

U.S. PATENT DOCUMENTS

| | | | |
|---|---|---|---|
| 4,128,804 | 12/1978 | Russell | 324/424 |
| 4,351,013 | 9/1982 | Matsko et al. | 324/424 X |
| 4,803,434 | 2/1989 | Walker | 324/424 |
| 4,814,712 | 3/1989 | Burton et al. | 324/424 |
| 5,010,438 | 4/1991 | Brady | 340/638 X |

Primary Examiner—Kenneth A. Wieder
Assistant Examiner—Glenn W. Brown
Attorney, Agent, or Firm—Terry M. Gernstein

[57] ABSTRACT

The operation and functioning of various elements in a circuit breaker panel assembly are monitored and tested using a permanently installed or a portable test module that can be plugged into a plug-in jack on the housing of the circuit breaker panel assembly. The test module includes readout elements, data recording elements as well as telemetry networks for relaying data to a central station where such data can be reduced, recorded and analyzed by experts. The circuit breaker panel can include a voltage surge and transient protection network. A method of monitoring and testing is also disclosed.

53 Claims, 7 Drawing Sheets

MEANS AND METHOD FOR TESTING AND MONITORING A CIRCUIT BREAKER PANEL ASSEMBLY

TECHNICAL FIELD OF THE INVENTION

The present invention relates to the general art of building installations which connect electronic equipment to a source of power, and to the particular field of panels and panel assemblies used to connect a building and/or equipment to utility power.

BACKGROUND OF THE INVENTION

Communications equipment, computers, work stations, automated test and production equipment, military targeting systems, home stereo systems, televisions, and other electronic devices as well as electrical loads using integrated circuits, solid state components, switching power supplies, semiconductor networks and the like, are increasingly characterized by small electrical contacts and miniature components which are very vulnerable to interference or damage due to interference from electrical disturbances carried by power line conductors connected thereto. Unpredictable variations in power line conductor voltage changes the operating range and can severely damage or destroy such devices. These devices and related process problems are very expensive to repair or to replace and therefore require cost-effective protection from transients and surges associated with the power.

Accordingly, the electrical art has included several devices for protecting sensitive communications and power installations, as well as other types of a-c loads, from damaging power surges and transients.

These devices are generally added on to a power distribution system. Examples of such "add on" devices are disclosed in patents such as U.S. Pat. No. 4,675,772 (the disclosure of which is incorporated herein by reference) and U.S. Pat. No. 4,835,650 (the disclosure of which is incorporated herein by reference). These devices are added to an already existing wiring system by being connected to a main breaker panel which connects building wiring to utility power wiring, or by being connected to a subpanel located at or near a point of use, such as at a floor or other such building area.

A circuit breaker panel assembly that is intended to protect communications and power installations, as well as other types of a-c loads, from damaging power surges and transients is disclosed in co-pending patent application Ser. No. 07/655,853, now U.S. Pat. No. 5,191,502, filed on Feb. 15, 1991 and assigned to the assignee of the present invention, and the disclosure of which is incorporated herein by reference. This panel assembly includes a voltage surge and transient protection circuit that is integral therewith, and overcomes the drawbacks noted above.

However, any circuit breaker panel assembly, even the assembly disclosed in the incorporated patent application, should be monitored, if not continuously, then on a systematic periodic basis. The inventor has found many problems that are attributed to equipment really are caused by problems in the circuit breaker panel assembly. Some of the problems are caused by overloading the panel or by improper wiring being connected to the panel after the panel has been installed in order to add equipment to the building, or because the panel assembly was not modified when non-linear loads were added, or the like. The inventor has also found that errors in wiring associated with the added equipment have created problems in the panel assemblies. Monitoring of such panels might alert the proper personnel about such problems at an early stage, or at least before such panel assembly related problems create equipment problems, or problems that are attributed to the equipment connected to the panel assembly. Furthermore, even in the normal course of operation, as user may wish to monitor to ensure that surge suppression and filtering are operating properly.

However, the inventor has found that at the present time, circuit breaker panels are monitored, if at all, only on an erratic basis with a possibility of long lapses between checks and are often monitored by personnel who are not fully versed in power technology and the theories, principles and problems associated therewith, and are not skilled in data analysis techniques. This erratic monitoring is even more erratic if there are numerous panel assemblies in a single building. In fact, some panel assemblies in remote or inaccessible locations of a building may never be monitored or checked after initial installation thereof.

Therefore, all circuit breaker panel assemblies, even that panel assembly disclosed in the incorporated patent application having an integral protector network, should be checked periodically to be sure that the panel assembly is functioning according to design criteria, and is providing results that are within design ranges. Some reasons for this need were alluded to above, and specific examples of the need are presented below.

For example, because light bulb and motor-type loads have neutral currents which are phasors that tend to sum to zero, many three-phase panels use a neutral bus which is sized for the same or smaller amperage as the phase supply connectors. This permits the neutral to be smaller and less expensive. However, computer loads (i.e., switching power supplies) are non-linear. They do not sum to zero on the neutral, but actually can sum to $3\frac{1}{2}$ larger than the phase currents. Still further, many panels have small lugs which necessitate the use of small wiring. Such small wiring may be a source of overheating, noise or voltage drops. The neutral bus in many of these panels is also subject to overheating. Overheating may impair the proper operation of the panel, and may even damage the bus. Therefore, a panel assembly that was designed for linear loads may be prone to problems if non-linear loads are connected thereto. Operation that endangers a panel assembly elements, such as a neutral bus, should be identified and corrected as soon as possible. Such identification of problems, especially with neutral bus overheating, is best carried out during a monitoring and testing operation of the circuit breaker panel assembly.

Still further, while a panel assembly may have been installed when a certain load was connected thereto, due to building modifications or the like, that same panel assembly may, at a later time, be required to carry more, or different, loads. This situation may occur when a panel assembly is installed in a multi-story building during construction of that building, and then not modified as the building is rented out to those who add loads to the panel assembly, or as more and more equipment is connected to the same panel assembly. The panel assembly may work well for some loading, but have various problems when that loading is exceeded or altered.

Therefore, there is a need for a means and a method for enabling a skilled technician or a skilled data analyst to monitor a circuit breaker panel assembly on a systematic basis, or even on a continuous basis. Of course such monitoring must be efficient and economical.

There is still further need for such circuit breaker panel assembly monitoring to be carried out to monitor specific parameters of the panel assembly as well as the performance of various components of the panel assembly, including any voltage surge and transient protection equipment associated with the panel assembly.

OBJECTS OF THE INVENTION

It is a main object of the present invention to provide a means and a method for monitoring and testing a circuit breaker panel assembly.

It is another object of the present invention to provide a means and a method for systematically monitoring a circuit breaker panel assembly.

It is another object of the present invention to provide a means and a method for enabling monitoring and testing a circuit breaker panel assembly by skilled personnel.

It is another object of the present invention to provide a means and a method for enabling a skilled individual to systematically monitor a circuit breaker panel assembly.

It is another object of the present invention to provide a means and a method for systematically monitoring particular parameters associated with a circuit breaker panel assembly.

It is another object of the present invention to provide a means and a method that is adaptable for continuously monitoring a circuit breaker panel assembly.

It is another object of the present invention to provide a means and a method for monitoring a circuit breaker panel assembly that is adaptable for on-site monitoring as well as for remote monitoring.

It is another object of the present invention to provide a means and a method for conducting on-site monitoring and testing a circuit breaker panel assembly.

It is another object of the present invention to provide a means and a method for conducting remote monitoring and testing a circuit breaker panel assembly.

It is another object of the present invention to provide a means and a method for monitoring operation of a voltage surge and transient protection network or other added functionality associated with a circuit breaker panel assembly.

It is a specific object of the present invention to provide a means and a method for monitoring temperature of a bus associated with a circuit breaker panel assembly.

It is another specific object of the present invention to provide a means and a method for monitoring ground integrity of a panel assembly and of the equipment associated with the panel assembly.

It is another specific object of the present invention to provide a means and a method for monitoring current flows in a circuit breaker panel assembly.

It is another specific object of the present invention to provide a means and a method for monitoring operation of an element of a voltage surge and transient protection network associated with a circuit breaker panel assembly.

It is another specific object of the present invention to provide a means and a method for monitoring operation of a voltage surge and transient suppressor element of a protection network associated with a circuit breaker panel assembly.

It is another specific object of the present invention to provide a means and a method for monitoring operation of a filter element of a protection network associated with a circuit breaker panel assembly.

It is another specific object of the present invention to provide a means and a method for monitoring temperature of a neutral bus associated with a circuit breaker panel assembly.

It is another specific object of the present invention to provide a means and a method for monitoring operation of a voltage surge and transient suppressor element of a protection network associated with a circuit breaker panel assembly and to provide protection against a shock being administered to a worker performing the monitoring and testing.

It is another specific object of the present invention to provide a means and a method for monitoring phase-to-phase integrity of a panel assembly and of the equipment associated with the panel assembly.

It is another specific object of the present invention to provide a means and a method for monitoring ground integrity of a panel assembly and of other panel assemblies associated therewith.

SUMMARY OF THE INVENTION

These, and other, objects are achieved by providing a circuit breaker panel assembly housing with one or more connection elements that are connected to various elements in the panel assembly and providing a test module that can be connected to the connection elements on the panel housing. The test module has read-out means, data recording means, transmitting means, and signalling means. The test module can be portable or can be affixed to the circuit breaker panel assembly housing. The test module has various circuits for applying voltage to a voltage surge suppressor, or for measuring temperature of various elements in the panel assembly, such as the neutral bus, or the like, or for testing ground integrity or phase-to-phase integrity. It is noted that while the present application refers to "surge suppressors" and "noise filters," any power conditioning device can be used, such as a harmonic type, or the like, without departing from the scope of the present disclosure.

The test module can also include means for recording various data. The module can also include means for transmitting the data over either landlines or over-the-air to a remotely located monitoring station. In this manner, the module can be connected with a large data bank either on a continuous basis or on a periodic basis. Furthermore, in one form of the invention, a receptacle is located adjacent to the panel assembly and is connected to the various elements in the panel assembly. A test module connection jack is provided on the receptacle so the test module can be connected to the receptacle.

Using the means and method of the present invention, the status and integrity of a circuit breaker panel assembly and any or all of the components thereof can be monitored and tested on any sort of schedule necessary to ensure proper operation of the circuit breaker panel assembly. However, this monitoring can be done in an efficient and cost-effective manner by a person skilled in analyzing the data obtained during the testing and monitoring. The data analyst can be the person connecting the test module to the panel assembly on site, or can be located at a central station to which the data is relayed via landlines or over-the-air, or returned in a memory means associated with the test module. The memory means can include chips or physical printout material, or both.

DETAILED DESCRIPTION OF THE PREFERRED EMBODIMENT OF THE INVENTION

Figure 1:
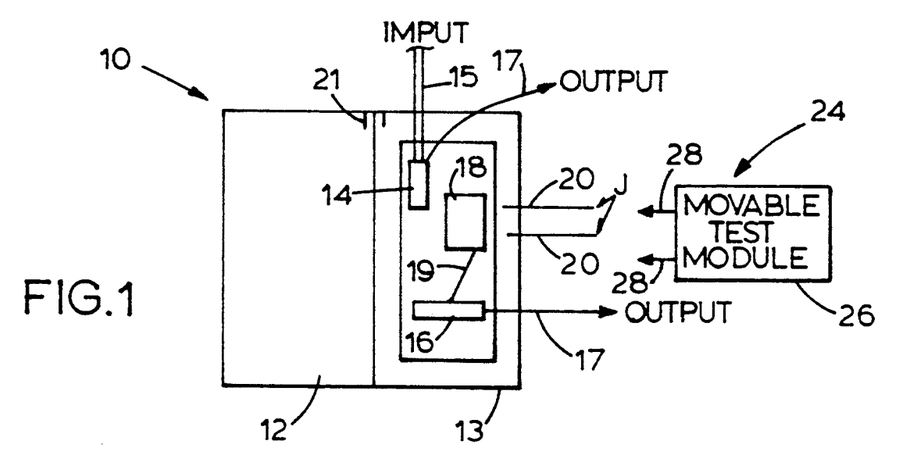
FIG. 1 illustrates a test module in combination with a circuit breaker panel assembly such as disclosed in the copending and incorporated application in which a voltage surge and transient protection network is integral with the panel assembly.

Shown in FIG. 1 is circuit breaker panel assembly 10 disclosed in the incorporated patent application. The assembly 10 has a door 12 mounted on a housing 13 to open and close that housing. The panel assembly includes a phase bus 14 having input lead 15 connected thereto, a neutral bus 16 having an output lead 17 connected thereto, and a voltage surge and transient protector network 18 connected to the phase bus and to the neutral bus by leads 19. One or more connection means J, such as plug-in jacks or the like, are mounted on the housing 13 of the assembly. Leads, such as leads 20 electrically connect the connection means J to various elements of the panel assembly, such as the surge and transient protection network, the phase and neutral buses, and the like. The panel assembly can also include an interlock means 21 associated with the door 12 to ensure that the door is not opened in a manner that might expose someone to a high voltage shock.

A test module 24 includes a housing 26 and one or more connection means 28, such as plug connectors, or the like for connection to the connection means J. The connection means 28 are electrically connected to various test circuits in the module as will be discussed below. The module 24 can be portable and/or can be carried about from place to place by a technician. When the test module is connected to appropriate connection means J on a panel assembly, various elements and circuits in the panel assembly can be tested and monitored and recorded by circuits in the test module, or the data can be relayed to a remote site where such data can be stored and analyzed.

Figure 2A:
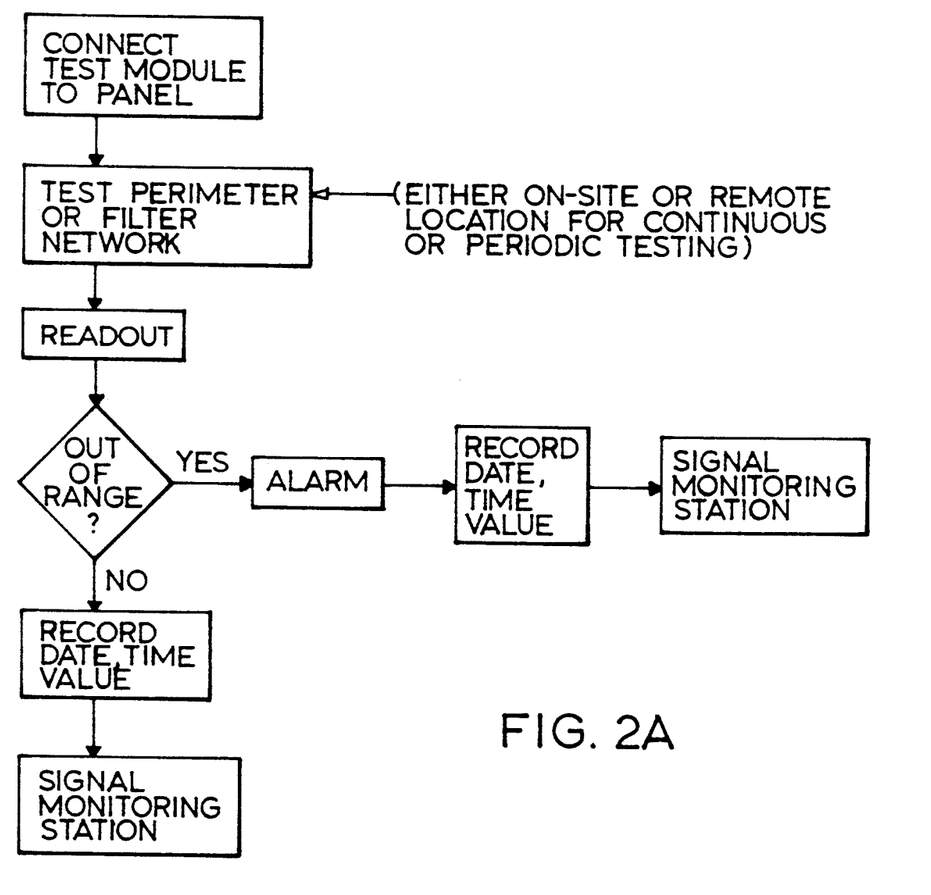
FIG. 2A is a block diagram illustrating a test and monitoring process of the present invention.

The monitoring and testing method using the portable test module 24 to monitor and test various elements and circuits in the panel assembly is shown in FIG. 2A. The method begins by connecting selected ones of the test module connection means 28 to appropriate ones of the panel assembly connection means J, and activating appropriate circuits in the test module as by operating switches or the like. After such activation, data from each circuit is read into the test module. This data can be displayed on the module by meters, or other such read-out devices, or can be recorded on tape or in a memory unit in the module. The time and date of the data reading can also be recorded in the test module. If appropriate, an alarm of some sort can be activated if any of the data is out of a desired range. The alarm can be visible, such as an LED on the module, or audible. This data can also be relayed to a central station at which it is recorded and analyzed. If the module is being used by someone skilled in analyzing data associated with circuit breaker panel assemblies, the data can be reviewed immediately, and any actions necessary can be undertaken or at least planned. Otherwise, the data can be stored in the test module and read out later by the analyst, or can be analyzed immediately at a central station if such a skilled analyst is available at that central station. In this manner, the data collected from a circuit breaker panel assembly can be reviewed and analyzed by simply plugging in a test module to that panel assembly. Computers and the like can be used to analyze the data and a periodic monitoring will be easy to carry out. This is especially true since the panel assembly need not be opened to connect the test module thereto.

Figure 2B:
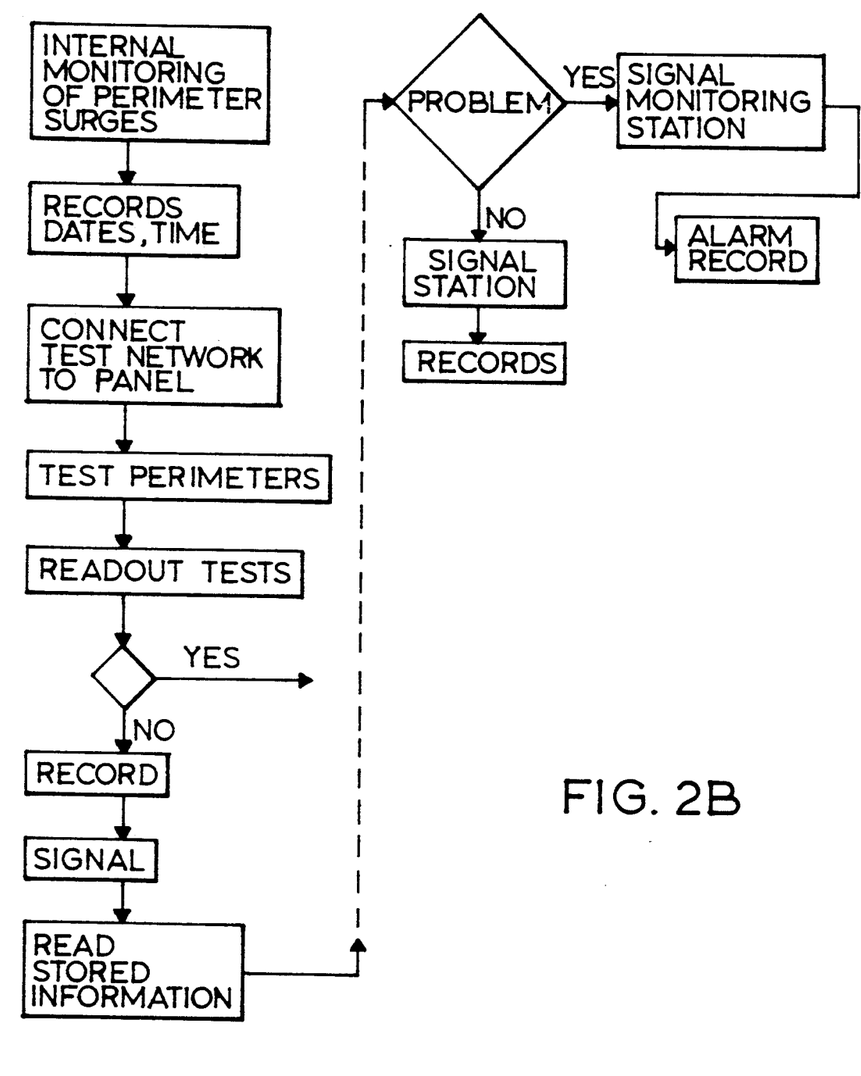
FIG. 2B is a block diagram illustrating an alternative form of a test and monitoring process of the present invention which includes a data recording system in the panel assembly.

FIG. 2B illustrates an alternative method of monitoring and testing a circuit breaker panel assembly in which some of the circuit breaker panel assembly elements are monitored and the data stored in memory means fixed to the panel assembly. The memory means can be separate from the test module and read by the test module by means of a data transfer when the test module is plugged into the panel connection jacks, or can be in a test module is permanently fixed to the panel assembly. The module or the data recording means can be located inside the panel assembly housing or can be located remote from that assembly and connected thereto by leads, such as leads 28. The operation of the assembly that includes a data memory means fixed to the panel housing is similar to that of the portable module. However, a timing mechanism can be included in such fixed data memory means to read data on a scheduled basis, and record the time and date of the reading, along with the reading. The data can be stored or relayed to a central station using telemetry equipment associated with the fixed data storage means. Alarms are also included, and can be quite useful in such a fixed module. The alarm circuits can set off an alarm at the panel, or in a specified location associated with the panel assembly, or at the central monitoring station. As will be discussed below, the relaying of data can be effected over landlines or over the air via a cellular system or the like.

Figure 2C:
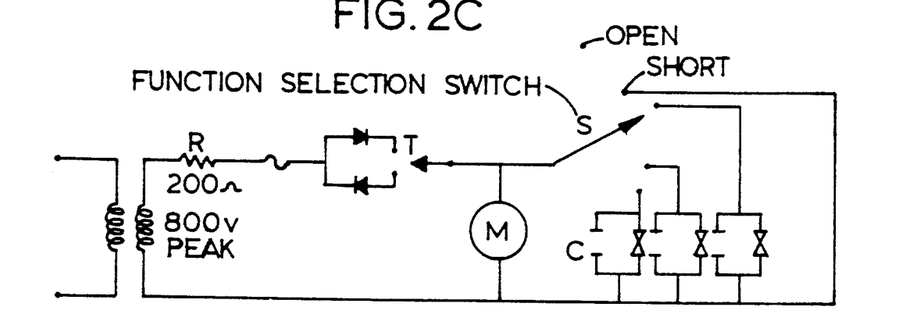
FIG. 2C illustrates a suppressor test set up.
Figure 2D:
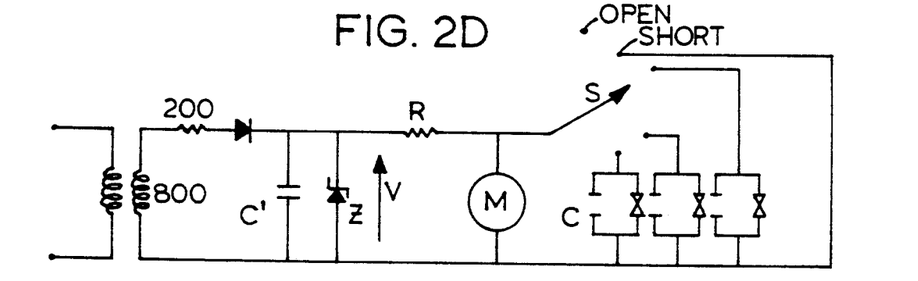
FIG. 2D illustrates a capacitor test set up.

FIGS. 2C and 2D illustrate specific test set-ups. FIG. 2C illustrates a set-up for testing a suppressor. A function is selected using switch S, then switch T is operated. If the suppressor is operating in a proper manner, a "clamped" reading on M of about 200 to 230 volts with a peak of about 120 V RMS (150 V actual) will be obtained. The value of resistor R is low enough to force enough voltage to exercise the suppressor and not be shunted by capacitor C.

FIG. 2D illustrates a set-up for testing a capacitor. The capacitor c is charged up to serve as a voltage source clamped by Z to a lower voltage V than the suppressor will activate on, such as 100 Volts or the like. Resistor R is a large value so that, for example, it may take five seconds for capacitor C to charge up to voltage V. If it takes less time, C has lost its value. If it never reaches V, C or the suppressor is considered as being "leaky" (that is, leakage current is flowing), and repair is required.

It is noted that the test process could be automated, with times, lights, or high frequency test signals used as desired. The resistor R can be replaced by a capacitor under proper conditions.

Figure 3:
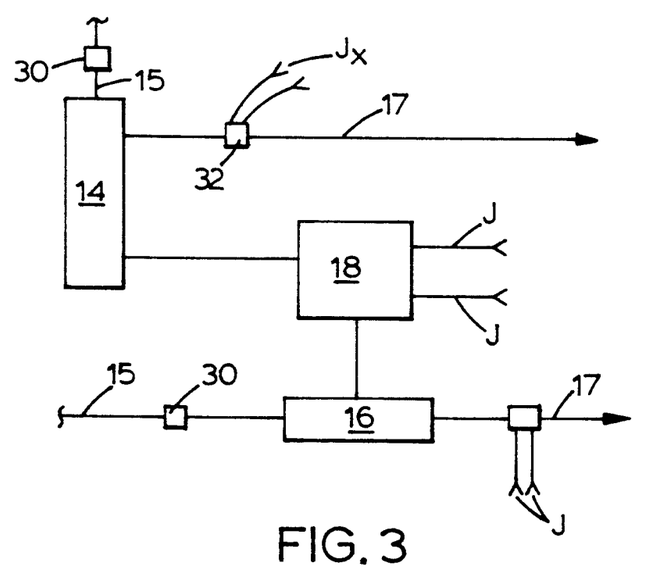
FIG. 3 illustrates a parameter monitoring set-up for the circuit breaker panel assembly.

It is understood that while various types of data can be collected, specific examples of the types of data that can be collected and monitored using the present means and method are illustrated in FIGS. 3–8. As shown in FIG. 3, current in the lead lines associated with the panel assembly can be measured and tested using appropriate circuit elements, such as element 30 in line 15 which can be an input line, a phase line, a neutral line, a ground input wire or the like, or element 32 in output line 17. The elements 30 and 32 are electrically connected to appropriate ones of the connection means J located on the housing 13, and the test module includes circuits designed to read the output of the elements 30 and 32, along with connection means 28 that can be connected to the appropriate ones of the connection means J, such as connection means $J_x$. Elements 30 and 32 can include a variety of current measuring means, including a simple coil wrapped around the lead and connected to an appropriate element.

Figure 4:
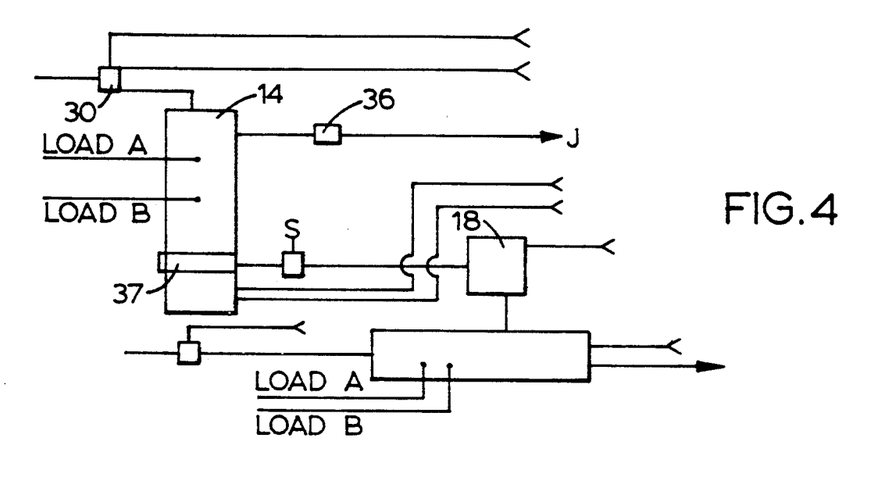
FIG. 4 illustrates another parameter monitoring set up for the circuit breaker panel assembly.

FIG. 4 illustrates a variation of the setup shown in FIG. 3 in which a plurality of loads are connected to the panel assembly. The state of the phase bus 14 is read directly by the element 36 and such element generates a signal that is relayed to an appropriate one of the connection means $J_1$ for reading by the test module. The voltage surge and transient suppressor network 18 is connected to the phase bus 14 by a branch circuit breaker 37 so test voltage can be applied to a suppressor element when the suppressor element is de-energized, and can include a switch S to connect or disconnect the network to and from the breaker 37. It is noted that the test voltage applied to the suppressor element is generally greater than the break-down voltage of that suppressor element. The readout of a meter in the test module will then be used to determine if the suppressor element is functioning according to design criteria. It is noted that phase-to-neutral voltage can also be used to test the suppressor element or to test panel voltage by connecting the test module across the appropriate elements in the circuit breaker panel assembly and activating appropriate test circuits and read-out devices in the test module.

Another test can be carried out when voltage is below the suppressor voltage. In such test, a filter capacitor element is tested and monitored. In addition to the tests illustrated in FIGS. 2C and 2D, the monitoring test box can be designed to test line voltage if elements 37 and S are closed, then the suppressor can be tested when elements 37 and S are opened.

Figure 5:
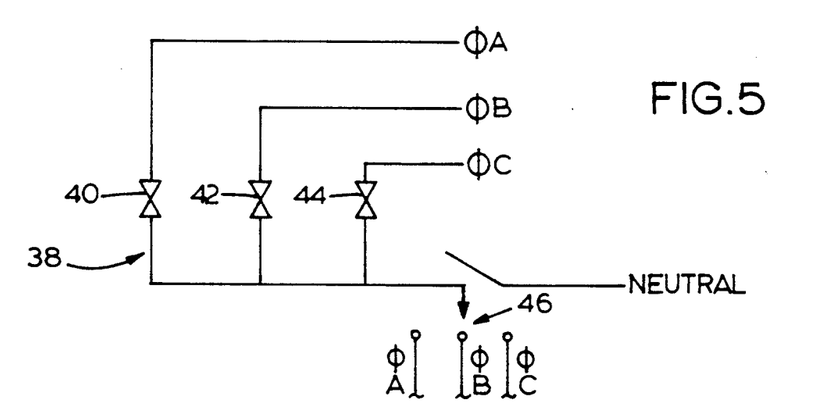
FIG. 5 illustrates a set up for testing and monitoring phase-to-phase voltage to test and monitor surge suppressor elements of a circuit breaker panel assembly.

The set up 38 shown in FIG. 5 uses phase-to-phase voltage between various phases as the test voltage to test surge suppressor elements 40, 42 and 44. A switch 46 is used to switch between phases. In the set up 38, the voltage existing between phases A and B or C is used to test the suppressor 40, as is the voltage between phases C and A or B for suppressors 44 or 42. The test voltage will always be greater than the suppressor breakdown voltage, and a voltmeter in the test module can be switched respectively across each suppressor. Suitable resistors are included to limit test currents to safe values, and switching of the suppressor neutral from the neutral associated with the phase buses allows full phase-to-phase voltage to be applied across the suppressors. As was the case before, the data generated from such phase-to-phase testing can be stored, read, or relayed as appropriate.

Figure 6:
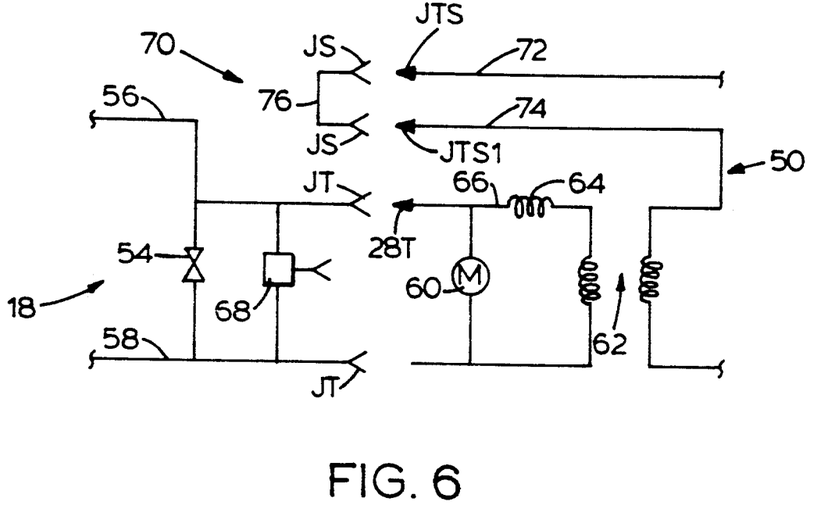
FIG. 6 illustrates a set up to test and monitor elements of a voltage surge and transient protection network associated with the circuit breaker panel assembly and which includes means for preventing operation of the test module until the test circuit is properly grounded and safely connected.

The test circuit 50 shown in FIG. 6 is used to test and monitor a voltage surge and transient protector network, such as network 18. The test circuit 50 is located in the test module and is interfaced with the network 18 in the panel assembly by means of connection means J and 28. The test circuit 50 includes plug-in jacks 28T that mate with jacks JT on the panel assembly or on the housing of a panel assembly or associated with a protector network, such as an MP series protectors, manufactured by Current Technology, Inc of Richardson, Tex. These plug-in jacks correspond to the jack J indicated in FIG. 1. The protector network 18 includes a surge suppressor 54 connected between lines 56 and 58, or between a phase bus and a neutral bus of the panel assembly. The test network 50 tests this surge suppressor and includes a meter 60 and a transformer 62 separated from each other by an impedance 64 in a line 66. A voltage presence indicating element 68 is also included in the panel or housing, and emits an alarm signal if voltage above a preset level is present across the suppressor element 54 when voltage is applied by the test network. The voltage presence indicating element can be connected to a data read-out or recording means in the test module via a jack JT whereby the reaction of this element can be monitored and recorded, such as to accurately monitor line voltage.

A safety interlock circuit 70 is included in the test circuit and includes a jack JTS connected to a lead 72 and a jack JTS1 connected to lead line 74 that is connected to one side of the transformer. These safety interlock circuit jacks will be located adjacent to the jacks 28T or can be part of that jack. The safety interlock further includes a lead line 76 connecting jacks JS on the panel assembly, and prevents an operator from receiving a shock as he sets up the test network. Alternatively, auxiliary contacts can be used via circuit breakers 37 (FIG. 4) and connector loads via jack 28T.

Figure 7:
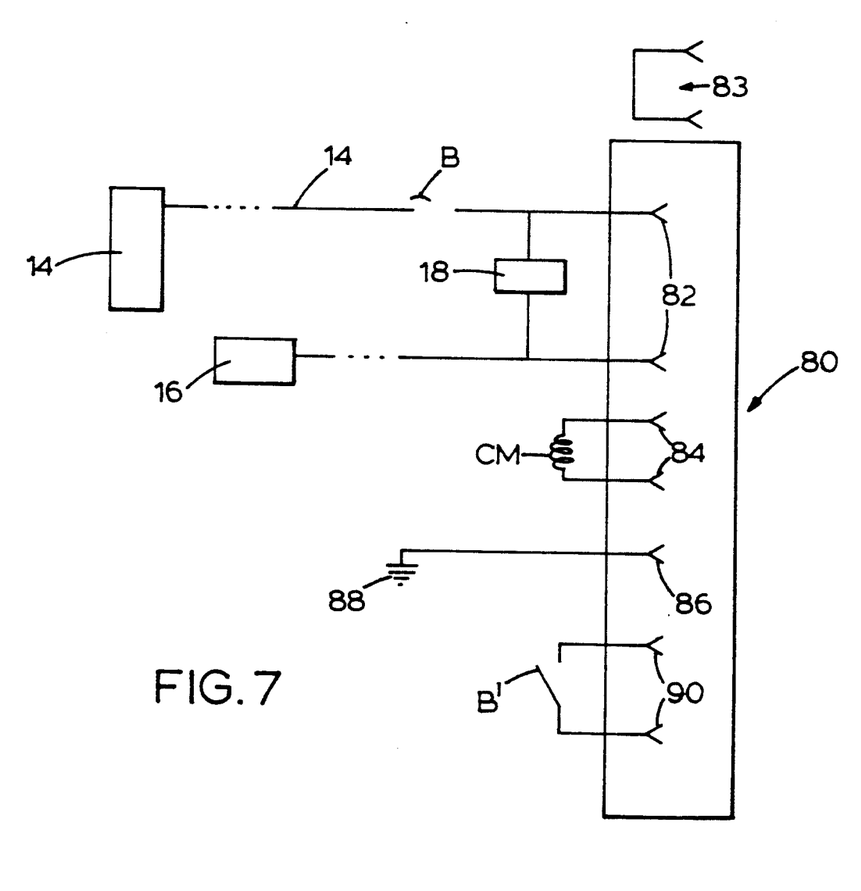
FIG. 7 illustrates a test network for testing and monitoring a plurality of different control features.

The test module 24 can be used to test and monitor various systems and networks in the panel assembly. An example of such multi-function monitoring is indicated in FIG. 7. The test module includes various test circuits, and various circuits in the panel assembly can be connected to an appropriate one of such test circuits via a multipurpose jack assembly 80. The voltage surge and transient protector network 18 can be connected to buses 14 and 16 by conductors 14" and 16" into which a circuit breaker B has been inserted, both for ease of installation of circuit 18 into conventional circuit breaker panels and to allow circuit 18 to be disconnected for maintenance or testing without requiring all other circuits, such as PC's or other such equipment to be turned off. Alternatively, breaker B may be a breaker located directly on bus 14, so that element 14" is not physically required. The jack 80 has numerous connectors, including connectors 82 that permit access to the suppressors in network 18 for testing, jumper 83 is on the panel assembly and may be used to control the test circuit for safety so it cannot be activated until securely plugged in thereby limiting accidental exposure to high voltage on the mating of the connector 80 to the panel assembly. Connectors 84 may be used to connect to other internal monitor features such as the current monitors 30 and 32, or to current monitor coil CM. Connector 86 may be used to connect to panel assembly isolated ground 88. Connectors 90 may connect to an auxiliary switch B' on circuit breaker B to indicate if it is off to allow activation of the remote test circuit.

Figure 8:
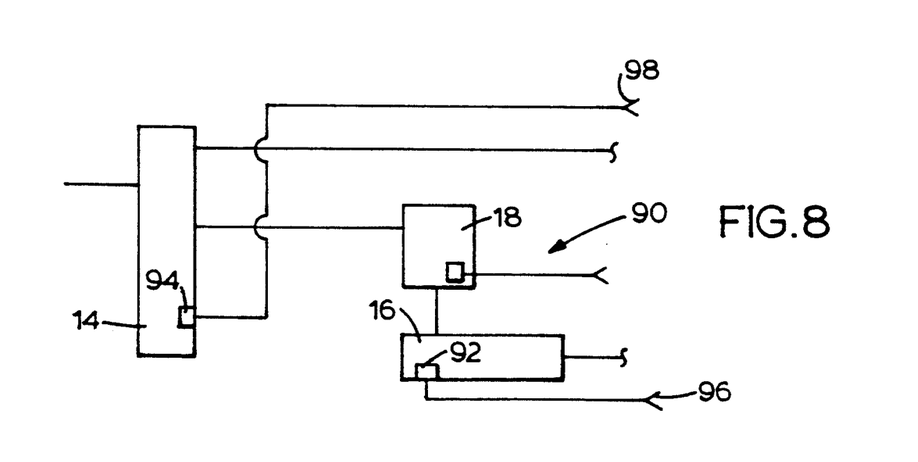
FIG. 8 illustrates a set up to monitor the temperature of various buses of the circuit breaker panel assembly.

Temperature of various components in the panel assembly can be measured and monitored using the test circuit 90 shown in FIG. 8. The circuit 90 includes temperature sensor transducers, such as transducer 92 mounted on a neutral bus 16 of the panel assembly or transducer 94 mounted on the phase bus 14 of the panel assembly. The temperature sensor transducers are connected to jacks 96 and 98 respectively and generate a signal dependant on the temperature sensed by the transducer. This signal is read by appropriate circuits or circuit elements in the test module once the appropriate connection means on the test module are connected to the connection means 96 and/or 98.

Figure 9:
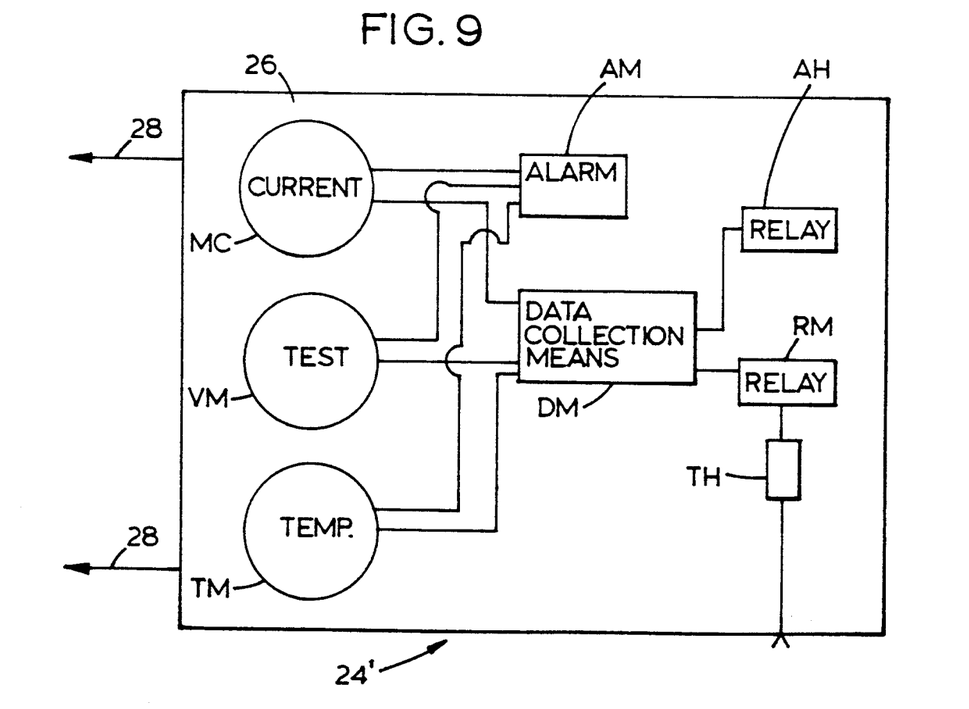
FIG. 9 illustrates test module of the present invention with various systems and readout means associated therewith.

A test module 24' is illustrated in FIG. 9 as including a plurality of meters, such as voltage readout means, such as a voltmeter VM, current readout means MC, temperature readout means TM and the like. An alarm means AM is connected to each of the readout means, and a data collection and storage means DM is also connected to each of the readout means. A relay means RM is connected to the storage means, and is used to relay data to a central station either via a telephone landline hookup TH via power line communication systems, or via an over-the-air hookup AH. Other readout means and other data collection and storage means can be included, and the illustration in FIG. 9 is intended to be illustrative only, and not limiting.

Figure 10:
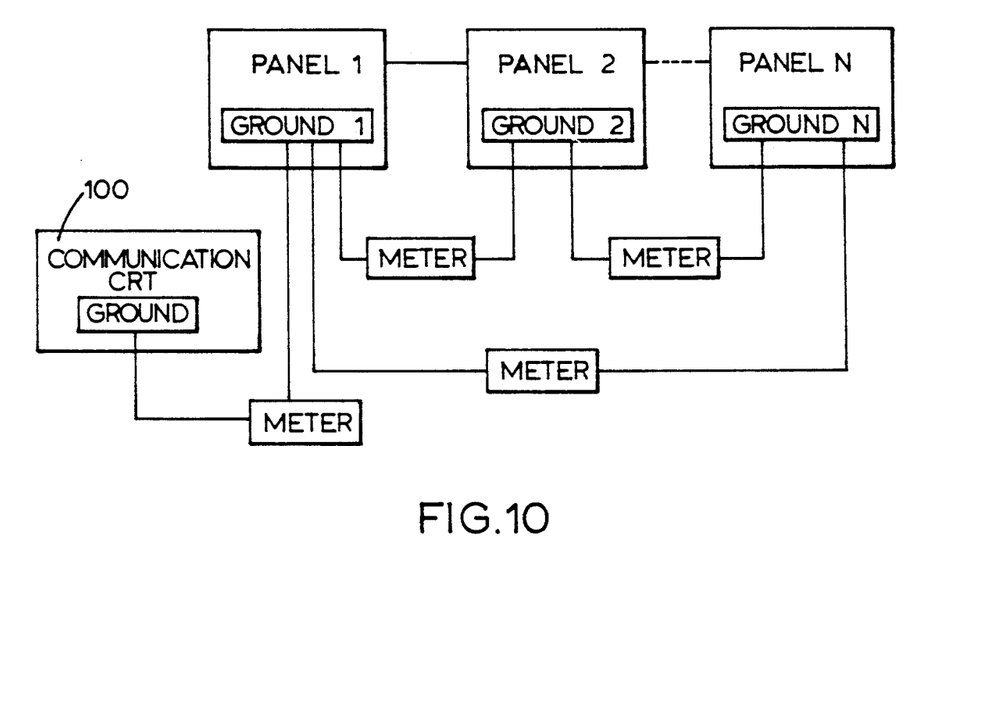
FIG. 10 illustrates a test circuit set up for testing ground connections between various panel assemblies in a multi-panel assembly system or between one panel assembly and a communications circuit ground.

The test module can also be used to monitor ground potentials between various panel assemblies. This is important in a building having several panels and subpanels, since all the panel assemblies should be at a common ground voltage level. Errors in data and the like can result if all panel assemblies are not at a common ground. The test means of the present invention can be connected between the grounds or neutral buses of two panel assemblies by simply plugging in appropriate jacks from the test module into appropriate jacks on the panel assemblies. The jacks on the test module are connected to a voltmeter, or the like, and any reading on the voltmeter will indicate a difference in ground level between the two panel assemblies. The test module voltmeter can be connected to an indicating element, such as an alarm, or the like, and can also be connected to data storage and relay means as discussed above. The test module can also be placed between a panel assembly and a data communications network 100 to measure and monitor the relative ground levels between the data communications network ground and the panel assembly ground. Ground currents may also be monitored as required. For example, monitoring may be conducted on an isolated ground bus within a panel or between panels and/or data communication networks.

The test module can be fixed in place to one panel assembly, or to the network or the like as discussed above and can monitor these elements on a timed basis and relay the data to a central station.

Figure 11:
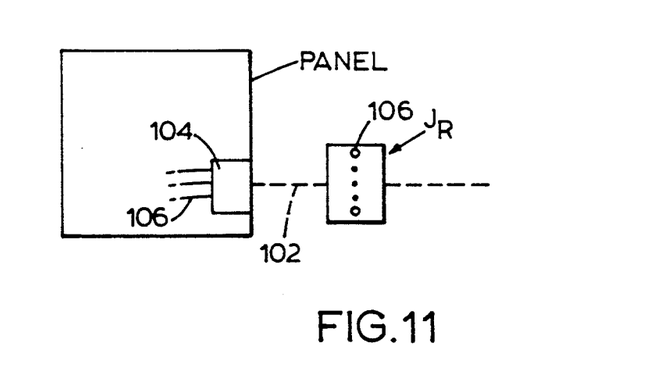
FIG. 11 illustrates a circuit breaker panel assembly electrically connected to a receptacle located adjacent to that assembly and into which a test module can be connected.

Shown in FIG. 11 is a setup in which a connector means $J_R$ is spaced from the panel housing of the panel assembly. The connector means $J_R$ is electrically connected to the panel assembly by a line means 102 that is electrically connected to a harness means 104 mounted on the panel assembly. The various networks and circuits and elements in the panel assembly are connected to the line means 102 at the harness means as indicated by the single chain dotted lines 106 in FIG. 11. The connector means $J_R$ is connected to the line means 102 and includes a plurality of connection jacks, such as connection jack 106 into which the connection means 28 of the test module are placed to connect the circuits of the test module to the elements of the panel assembly. The line means 102 can also include the output lines 17 of the panel assembly. The line means 102 can thus include a plurality of different lines. The connection means $J_R$ can be fixed in place adjacent to the panel assembly. Since an output line is connected to the receptacle $J_R$, the circuit breaker panel assembly housing need not be opened in order to connect various loads to that panel assembly.

It is understood that while certain forms of the present invention have been illustrated and described herein, it is not to be limited to the specific forms or arrangements of parts described and shown.

I claim:

1. In a distribution panel assembly for use in connecting a load to a source of power, said distribution panel assembly comprising a housing, a phase bus mounted therein and a voltage surge and transient protector network mounted therein, the improvement in combination therewith comprising:

voltage surge and transient suppressor and filtering elements on the distribution panel assembly;

plug-in connection means on the distribution panel assembly housing and leads connecting said plug-in connection means to said voltage surge and transient suppressor and filtering elements on the distribution panel assembly; and a test network for testing and monitoring said voltage surge and transient suppressor and filtering elements on the distribution panel assembly, said test network including plug connecting means for connection to said plug-in connection means on said housing for connecting said test network to said voltage surface and transient suppressor and filtering elements on the distribution panel assembly housing, and means for applying a test voltage to said voltage surge and transient suppressor and filtering elements, said test voltage being greater than suppressor breakdown voltage.

2. The improvement defined in claim 1 further including a module housing containing said test network.

3. The improvement defined in claim 2 wherein said module housing is separate from said distribution panel assembly housing.

4. The improvement defined in claim 1 wherein said test network includes readout means.

5. The improvement defined in claim 3 wherein the distribution panel includes a neutral bus.

6. The improvement defined in claim 5 wherein said test network includes means for testing and monitoring said phase bus.

7. The improvement defined in claim 6 wherein said test network further includes means for testing and monitoring the neutral bus.

8. The improvement defined in claim 7 wherein said means for current testing and monitoring current flow includes means for measuring and testing current flow in said neutral bus.

9. The improvement defined in claim 8 wherein said test network includes a transformer for generating a test voltage across said voltage suppressor.

10. The improvement defined in claim 9 wherein said test network includes a safety interlock circuit having means for preventing an operator from receiving an electrical shock as that operator connectors the test network to said housing.

11. The improvement defined in claim 10 wherein said safety interlock circuit includes two jacks connected together and a line conductor connected to one of said jacks, with said line conductor being connected to one side of said transformer.

12. The improvement defined in claim 11 further including a lead line connecting said two jacks together.

13. The improvement defined in claim 8 wherein said test network includes a means for generating a high frequency signal across a capacitor.

14. The improvement defined in claim 8 wherein said test network includes a transformer for generating a noise signal across a capacitor.

15. The improvement defined in claim 7 wherein said test network further includes means for measuring and monitoring temperature of said neutral bus.

16. The improvement defined in claim 7 wherein the distribution panel assembly further includes a plurality of phase buses, and said test network includes means for measuring and monitoring phase-to-phase voltage between phase buses of said plurality of phase buses.

17. The improvement defined in claim 5 wherein said test network further includes means for testing filter elements.

18. The improvement defined in claim 5 wherein said test network further includes means for current testing and monitoring current flow in elements in the breaker panel assembly.

19. The improvement defined in claim 18 wherein said means for current testing and monitoring current flow includes means for measuring and testing current flow in said phase bus.

20. The improvement defined in claim 4 wherein said test network further includes an alarm means.

21. The improvement defined in claim 4 wherein said test network further includes means for measuring and monitoring temperature of a selected bus.

22. The improvement defined in claim 1 wherein said test network includes means for transmitting data to a remote location.

23. The improvement defined in claim 22 wherein said data transmitting means includes means for transmitting data over landlines.

24. The improvement defined in claim 22 wherein said data transmitting means includes means for transmitting data over the air.

25. The improvement defined in claim 22 wherein said data transmitting means includes means for transmitting data over power lines.

26. The improvement defined in claim 1 wherein said test network includes means for recording data.

27. The improvement defined in claim 1 wherein said test network includes means for testing and monitoring elements in a plurality of distribution panels.

28. The improvement defined in claim 27 further including means for testing and monitoring grounds of each panel in said plurality of distribution panels.

29. The improvement defined in claim 1 wherein said test network includes means for testing and monitoring ground levels of and between the distribution panel assembly and another element.

30. The improvement defined in claim 1 wherein the panel includes a plurality of plug-in connection means each connected to a circuit in the distribution panel assembly to be tested, and said test network connecting means including a plurality of connection means and a plurality of test circuits, each of said plurality of connection means being associated with a test circuit of said test network.

31. The improvement defined in claim 1 further including at least one jack in the housing.

32. The improvement defined in claim 31 wherein the distribution panel assembly includes a neutral bus and wherein said test network further includes a voltmeter, a switch connected to said voltmeter, and a jack connected to said switch and adapted to place said voltmeter between said phase and neutral buses to use phase-to-phase voltage to test panel voltage.

33. The improvement defined in claim 32 wherein said test network further includes means for testing phase-to-phase voltage in the panel assembly.

34. The improvement defined in claim 31 wherein said test network includes means for testing ground current, phase-to-phase voltage and neutral current.

35. The improvement defined in claim 34 wherein said test network further includes a plug-in connecting means for permitting testing a suppressor network and parameters by means of a plug-in test device.

36. The improvement defined in claim 35 wherein said voltage surge and transient suppressor and filtering elements are installed via a branch circuit breaker with auxiliary contacts to enable test source voltage to be applied to a selected element when said branch circuit breaker is de-activated to de-energize that selected element.

37. The improvement defined in claim 34 wherein said test network includes telemetry means and data acquisition means for monitoring the distribution panel assembly from a location remote from the distribution panel assembly.

38. The distribution panel defined in claim 1 wherein said test network includes a function selection switch connected to said voltage surge and transient suppressor and filtering elements and an on/off switch connected to said function selection switch and to a power source.

39. The improvement defined in claim 38 wherein said function selection switch includes an "open" terminal and a "short" terminal.

40. The improvement defined in claim 38 wherein said test network includes a readout means connected to said function selection switch to be placed in parallel across one of said voltage surge and transient suppressor and filter elements when said function selection switch is operated to be connected to said voltage surge and transient suppressor and filtering elements.

41. The improvement panel defined in claim 40 wherein said readout means includes a voltmeter.

42. The improvement defined in claim 41 wherein said test network includes a capacitor and a clamping diode.

43. The improvement panel defined in claim 1 wherein said means for applying a test voltage includes a transformer.

44. A method of monitoring and testing selected elements in a distribution panel assembly comprising steps of:
 A) providing a distribution panel assembly for use in connecting a load to a source of power, said distribution panel assembly comprising a housing, a phase bus mounted therein and a voltage surge and transient protector network mounted in the distribution panel assembly, voltage surge and transient suppressor and filtering elements on the distribution panel; plug-in connection means on the distribution panel housing and leads connecting said plug-in connection means to said voltage surge and transient suppressor and filtering elements on the distribution panel; and a test network for testing and monitoring said voltage surge and transient suppressor and filtering elements on the distribution panel, said test network including plug connecting means for connection to said plug-in connection means on said housing for connecting said test network to said elements inside the distribution panel housing, and means for applying a test voltage to said voltage surge and transient suppressor and filtering elements, said test voltage being greater than suppressor breakdown voltage;
 B) connecting a test module to selected ones of the voltage surge and transient suppressor and filter elements;
 C) applying the test voltage to said selected ones of the voltage surge and transient suppressor and filter elements; and
 D) monitoring the voltage of said selected ones of the voltage surge and transient suppressor and filter elements to be sure that the voltage associated with said selected ones of the voltage surge and transient suppressor and filter elements is not greater than a predetermined value.

45. The method defined in claim 44 wherein said test network further includes means for preventing application of a test voltage to said voltage surge and transient suppressor and filtering elements until said test network is properly grounded.

46. The method defined in claim 44 further including a step of ensuring that said test network is properly grounded and safely connected before applying said test voltage.

47. The method defined in claim 44 wherein said step of monitoring the voltage of selected ones of the voltage surge and transient suppressor and filter elements includes continuously monitoring and testing said selected ones of the voltage surge and transient suppressor and filter elements.

48. The method defined in claim 44 further including recording results of said step of monitoring the voltage of said selected ones of the voltage surge and transient suppressor and filter elements.

49. The method defined in claim 44 further including transmitting data from said monitoring step to a remote location.

50. The method defined in claim 44 further including activating an alarm if any of said selected ones of the voltage surge and transient suppressor and filter elements is operating out of a selected range.

51. The method defined in claim 50 further including monitoring temperature of said selected ones of the voltage surge and transient suppressor and filter elements.

52. The method defined in claim 50 further including monitoring current flow associated with said selected ones of the voltage surge and transient suppressor and filter elements.

53. A distribution circuit breaker panel assembly for use in connecting a load to a source of power comprising:
 A) a housing with a base;
 B) a phase bus mounted directly on said base;
 C) a neutral bus mounted directly on said base, said neutral bus being larger in current carrying capability than said phase bus;
 D) a voltage surge and transient protector network mounted directly on said base to be unitary and integral with said base, said voltage surge and transient protector network including a capacitor and a voltage suppressor element; and
 E) a plurality of lugs electrically connected to said neutral bus;
 F) plug-in connection means on the circuit breaker panel assembly housing and leads connecting said plug-in connection means to circuit breaker panel assembly elements located inside the circuit breaker panel assembly housing; and
 G) a test network for testing and monitoring said elements inside the breaker panel assembly, said test network including plug connecting means for connection to said plug-in connection means on said housing for connecting said test network to said voltage suppressor element inside the circuit breaker panel assembly housing, said test voltage being greater than suppressor breakdown voltage.

* * * * *